(12) United States Patent
Tanaka et al.

(10) Patent No.: US 8,277,680 B2
(45) Date of Patent: Oct. 2, 2012

(54) METHOD OF MANUFACTURING PIEZOELECTRIC/ELECTROSTRICTIVE CERAMIC COMPOSITION

(75) Inventors: Ritsu Tanaka, Aichi (JP); Hirofumi Yamaguchi, Aichi (JP)

(73) Assignee: NGK Insulators, Ltd., Nagoya (JP)

( * ) Notice: Subject to any disclaimer, the term of this patent is extended or adjusted under 35 U.S.C. 154(b) by 441 days.

(21) Appl. No.: 12/507,199

(22) Filed: Jul. 22, 2009

(65) Prior Publication Data

US 2010/0022381 A1    Jan. 28, 2010

(30) Foreign Application Priority Data

Jul. 28, 2008 (JP) ................................. 2008-193383

(51) Int. Cl.
*H01L 41/187* (2006.01)
(52) U.S. Cl. .................. 252/62.9 R; 501/134
(58) Field of Classification Search ............. 252/62.9 R; 501/134
See application file for complete search history.

(56) References Cited

U.S. PATENT DOCUMENTS

2004/0058797 A1  3/2004 Nonoyama et al.
2009/0020726 A1  1/2009 Uraki et al.

FOREIGN PATENT DOCUMENTS

| EP | 1876155 A1 | 1/2008 |
|---|---|---|
| EP | 1895607 A2 | 3/2008 |
| EP | 2058288 A2 | 5/2009 |
| JP | 2004-244300 | 9/2004 |
| JP | 2005-281013 A1 | 10/2005 |
| WO | 2007/099901 A1 | 9/2007 |
| WO | 2008/032500 | 3/2008 |

OTHER PUBLICATIONS

Japanese Office Action (with partial English translation provided by Applicants' Japanese representatives) from a corresponding Japanese patent application bearing a mailing date of Mar. 21, 2012.
Extended European Search Report, European Patent Application No. 09251855.4, dated Jun. 13, 2012 (4 pages).

*Primary Examiner* — Carol M Koslow
(74) *Attorney, Agent, or Firm* — Burr & Brown

(57) ABSTRACT

A (Li, Na, K)(Nb, Ta)$O_3$-based piezoelectric/electrostrictive ceramic composition having large electric field-induced distortion at the time of application of a high electric field is provided. A perovskite oxide is synthesized which contains Li (lithium), Na (sodium) and K (potassium) as A-site elements and contains at least Nb (niobium) and Sb (antimony) out of Nb, Ta (tantalum) and Sb as B-site elements, the ratio of the total number of atoms of the A-site elements to the total number of atoms of the B-site elements being larger than 1, and then a Bi (bismuth) compound is added and reacted. The amount of addition of the Bi compound with respect to 100 molar parts of the perovskite oxide is preferably not less than 0.02 molar part nor more than 0.1 molar part in terms of Bi atoms.

6 Claims, 11 Drawing Sheets

| SAMPLE | COMPOSITION | | | | | | | S4000 (ppm) | |
|---|---|---|---|---|---|---|---|---|---|
| | x | y | a | z | w | m | n | BEFORE HIGH-TEMPERATURE AGING | AFTER HIGH-TEMPERATURE AGING |
| A1 | 0.45 | 0.06 | 1.01 | 0.082 | 0.04 | 0.02 | 0 | 580 | 740 |
| A2 | 0.45 | 0.06 | 1.01 | 0.082 | 0.04 | 0.02 | 0.02 | 675 | 845 |
| A3 | 0.45 | 0.06 | 1.01 | 0.082 | 0.04 | 0.02 | 0.03 | 680 | 860 |
| A4 | 0.45 | 0.06 | 1.01 | 0.082 | 0.04 | 0.02 | 0.06 | 665 | 830 |
| A5 | 0.45 | 0.06 | 1.01 | 0.082 | 0.04 | 0.02 | 0.1 | 620 | 785 |
| A6 | 0.45 | 0.06 | 1.01 | 0.082 | 0.04 | 0.02 | 0.2 | — | — |

$100\{Li_y(Na_{1-x}K_x)_{1-y}\}_a(Nb_{1-z-w}Ta_zSb_w)O_3 + mMnO_2 + n1/2(Bi_2O_3)$

F I G. 1 0

| SAMPLE | COMPOSITION | | | | | | | | S4000 (ppm) | |
|---|---|---|---|---|---|---|---|---|---|---|
| | x | y | a | z | w | m | n | | BEFORE HIGH-TEMPERATURE AGING | AFTER HIGH-TEMPERATURE AGING |
| A1 | 0.45 | 0.06 | 1.01 | 0.082 | 0.04 | 0.02 | 0 | | 580 | 740 |
| A2 | 0.45 | 0.06 | 1.01 | 0.082 | 0.04 | 0.02 | 0.02 | | 675 | 845 |
| A3 | 0.45 | 0.06 | 1.01 | 0.082 | 0.04 | 0.02 | 0.03 | | 680 | 860 |
| A4 | 0.45 | 0.06 | 1.01 | 0.082 | 0.04 | 0.02 | 0.06 | | 665 | 830 |
| A5 | 0.45 | 0.06 | 1.01 | 0.082 | 0.04 | 0.02 | 0.1 | | 620 | 785 |
| A6 | 0.45 | 0.06 | 1.01 | 0.082 | 0.04 | 0.02 | 0.2 | | — | — |

$100\{Li_y(Na_{1-x}K_x)_{1-y}\}a(Nb_{1-z-w}T a_z Sb_w)O_3 + mMnO_2 + n1/2(Bi_2O_3)$

FIG. 11

| SAMPLE | COMPOSITION | | | | | | | | $S_{4000}$ (ppm) | |
|---|---|---|---|---|---|---|---|---|---|---|
| | x | y | a | z | w | m | n | | BEFORE HIGH-TEMPERATURE AGING | AFTER HIGH-TEMPERATURE AGING |
| B1 | 0.6 | 0.07 | 1.1 | 0.3 | 0.06 | 1 | 0 | | 560 | 700 |
| B2 | 0.6 | 0.07 | 1.1 | 0.3 | 0.06 | 1 | 0.02 | | 615 | 795 |
| B3 | 0.6 | 0.07 | 1.1 | 0.3 | 0.06 | 1 | 0.1 | | 600 | 775 |
| B4 | 0.6 | 0.07 | 1.1 | 0.3 | 0.06 | 1 | 0.2 | | — | — |
| C1 | 0.3 | 0.03 | 1.005 | 0.03 | 0.01 | 0.02 | 0 | | 550 | 720 |
| C2 | 0.3 | 0.03 | 1.005 | 0.03 | 0.01 | 0.02 | 0.02 | | 605 | 810 |
| C3 | 0.3 | 0.03 | 1.005 | 0.03 | 0.01 | 0.02 | 0.1 | | 595 | 790 |
| C4 | 0.3 | 0.03 | 1.005 | 0.03 | 0.01 | 0.02 | 0.2 | | — | — |

$100\{Li_y(Na_{1-x}K_x)_{1-y}\}_a(Nb_{1-z-w}Ta_zSb_w)O_3 + mMnO_2 + n1/2(Bi_2O_3)$

FIG. 12

| SAMPLE | COMPOSITION | | | | | | | $S_{4000}$ (ppm) | |
|---|---|---|---|---|---|---|---|---|---|
| | x | y | a | z | w | m | n | BEFORE HIGH-TEMPERATURE AGING | AFTER HIGH-TEMPERATURE AGING |
| D1 | 0.45 | 0.06 | 1 | 0.082 | 0.04 | 0.02 | 0.03 | — | — |
| D2 | 0.45 | 0.06 | 1.01 | 0.082 | 0.04 | 0.02 | 0.03 | 665 | 840 |
| D3 | 0.45 | 0.06 | 1.05 | 0.082 | 0.04 | 0.02 | 0.03 | 620 | 800 |
| D4 | 0.45 | 0.06 | 1.1 | 0.082 | 0.04 | 0.02 | 0.03 | 600 | 780 |

$100\{Li_y(Na_{1-x}K_x)_{1-y}\}a(Nb_{1-z-w}Ta_zSb_w)O_3 + mMnO_2 + n1/2(Bi_2O_3)$

FIG. 13

| SAMPLE | COMPOSITION | | | | | | | | $S_{4000}$ (ppm) | |
|---|---|---|---|---|---|---|---|---|---|---|
| | x | y | a | z | w | m | n | BEFORE HIGH-TEMPERATURE AGING | AFTER HIGH-TEMPERATURE AGING |
| E1 | 0.45 | 0.03 | 1.01 | 0.082 | 0.04 | 0.02 | 0.03 | 590 | 755 |
| E2 | 0.45 | 0.07 | 1.01 | 0.082 | 0.04 | 0.02 | 0.03 | 640 | 815 |
| F1 | 0.3 | 0.06 | 1.01 | 0.082 | 0.04 | 0.02 | 0.03 | 595 | 760 |
| F2 | 0.6 | 0.06 | 1.01 | 0.082 | 0.04 | 0.02 | 0.03 | 610 | 800 |
| G1 | 0.45 | 0.06 | 1.01 | 0 | 0.04 | 0.02 | 0.03 | 585 | 760 |
| G2 | 0.45 | 0.06 | 1.01 | 0.2 | 0.04 | 0.02 | 0.03 | 610 | 790 |
| G3 | 0.45 | 0.06 | 1.01 | 0.3 | 0.04 | 0.02 | 0.03 | 590 | 770 |
| H1 | 0.45 | 0.06 | 1.01 | 0.082 | 0.01 | 0.02 | 0.03 | 665 | 825 |
| H2 | 0.45 | 0.06 | 1.01 | 0.082 | 0.06 | 0.02 | 0.03 | 640 | 805 |
| I1 | 0.45 | 0.06 | 1.01 | 0.082 | 0.04 | 0.05 | 0.03 | 670 | 845 |
| I2 | 0.45 | 0.06 | 1.01 | 0.082 | 0.04 | 0.1 | 0.03 | 675 | 855 |
| I3 | 0.45 | 0.06 | 1.01 | 0.082 | 0.04 | 1 | 0.03 | 660 | 830 |
| I4 | 0.45 | 0.06 | 1.01 | 0.082 | 0.04 | 0 | 0.03 | 540 | 720 |
| I5 | 0.45 | 0.06 | 1.01 | 0.082 | 0.04 | 0 | 0 | 420 | 580 |

$100\{Li_y(Na_{1-x}K_x)_{1-y}\}_a(Nb_{1-z-w}Ta_zSb_w)O_3 + mMnO_2 + n1/2(Bi_2O_3)$

F I G. 1 4

| SAMPLE | COMPOSITION | | | | | | | | $S_{4000}$ (ppm) | |
|---|---|---|---|---|---|---|---|---|---|---|
| | x | y | a | z | w | m | n | | BEFORE HIGH-TEMPERATURE AGING | AFTER HIGH-TEMPERATURE AGING |
| J1 | 0.45 | 0.06 | 1.01 | 0.082 | 0.04 | 0.02 | 0.03 | | 575 | 720 |
| J2 | 0.45 | 0.06 | 1.01 | 0.082 | 0.04 | 0.02 | 0.1 | | — | — |

$100\{Li_y(Na_{1-x}K_x)_{1-y}\}_a(Nb_{1-z-w}Ta_zSb_w)O_3 + mMnO_2 + n1/2(Bi_2O_3)$

METHOD OF MANUFACTURING PIEZOELECTRIC/ELECTROSTRICTIVE CERAMIC COMPOSITION

FIELD OF THE INVENTION

The present invention relates to a method of manufacturing a piezoelectric/electrostrictive ceramic composition.

BACKGROUND OF THE INVENTION

Piezoelectric/electrostrictive actuators have the advantage of being capable of precisely controlling displacement in the order of submicrons. In particular, piezoelectric/electrostrictive actuators using the sintered body of a piezoelectric/electrostrictive ceramic composition as the piezoelectric/electrostrictive body further have the advantages of offering high electric-mechanical conversion efficiency, high generation power, high response speed, high durability, and low power consumption, in addition to the advantage of being capable of precisely controlling displacement. For these advantages, such piezoelectric/electrostrictive actuators have been adopted for the heads of inkjet printers and the injectors of diesel engines.

As the piezoelectric/electrostrictive ceramic compositions for piezoelectric/electrostrictive actuators, Pb (Zr, Ti)$O_3$ (PZT)-based piezoelectric/electrostrictive ceramic compositions have been conventionally used, but (Li, Na, K)(Nb, Ta)$O_3$-based piezoelectric/electrostrictive ceramic compositions are also studied since concerns are rising that the elution of lead from sintered bodies seriously influences the global environment.

Also, as described in Japanese Patent Application Laid-Open No. 2005-281013, adding Bi and Mn to (Li, Na, K)(Nb, Ta)$O_3$-based piezoelectric/electrostrictive ceramic compositions is also proposed in order to improve the deliquescent properties and insulation properties of the (Li, Na, K)(Nb, Ta)$O_3$-based piezoelectric/electrostrictive ceramic compositions.

However, conventional (Li, Na, K)(Nb, Ta)$O_3$-based piezoelectric/electrostrictive ceramic compositions have the problem that they fail in offering sufficient electric field-induced distortion at the time of application of a high electric field, which is an important factor for piezoelectric/electrostrictive actuators.

SUMMARY OF THE INVENTION

According to a first aspect of the present invention, a method of manufacturing a piezoelectric/electrostrictive ceramic composition includes the steps of: (a) synthesizing a perovskite oxide containing Li, Na and K as A-site elements and containing at least Nb and Sb, out of Nb, Ta and Sb, as B-site elements, the ratio of the total number of atoms of the A-site elements to the total number of atoms of the B-site elements being larger than 1; and (b) reacting the perovskite oxide synthesized in said step (a) and an additive, wherein the additive reacted in said step (b) includes a Bi compound.

A (Li, Na, K)(Nb, Ta)$O_3$-based piezoelectric/electrostrictive ceramic composition having large electric field-induced distortion at the time of application of a high electric field can be provided.

An object of the present invention is to provide a (Li, Na, K)(Nb, Ta)$O_3$-based piezoelectric/electrostrictive ceramic composition having large electric field-induced distortion at the time of application of a high electric field.

Features, aspects and advantages of the present invention will become more apparent from the following detailed description and the accompanying drawings.

BRIEF DESCRIPTION OF THE DRAWINGS

FIG. 10 is a diagram showing the compositions and distortion ratios $S_{4000}$ of experimental samples A1 to A6 in list form.

FIG. 11 is a diagram showing the compositions and distortion ratios $S_{4000}$ of experimental samples B1 to B4 and C1 to C4 in list form.

FIG. 12 is a diagram showing the compositions and distortion ratios $S_{4000}$ of experimental samples D1 to D4 in list form.

FIG. 13 is a diagram showing the compositions and distortion ratios $S_{4000}$ of experimental samples E1 to E2, F1 to F2, G1 to G3, H1 to H2, and I1 to I5 in list form.

FIG. 14 is a diagram showing the compositions and distortion ratios $S_{4000}$ of experimental samples J1 to J2 in list form.

DETAILED DESCRIPTION OF THE INVENTION

Figure 1:
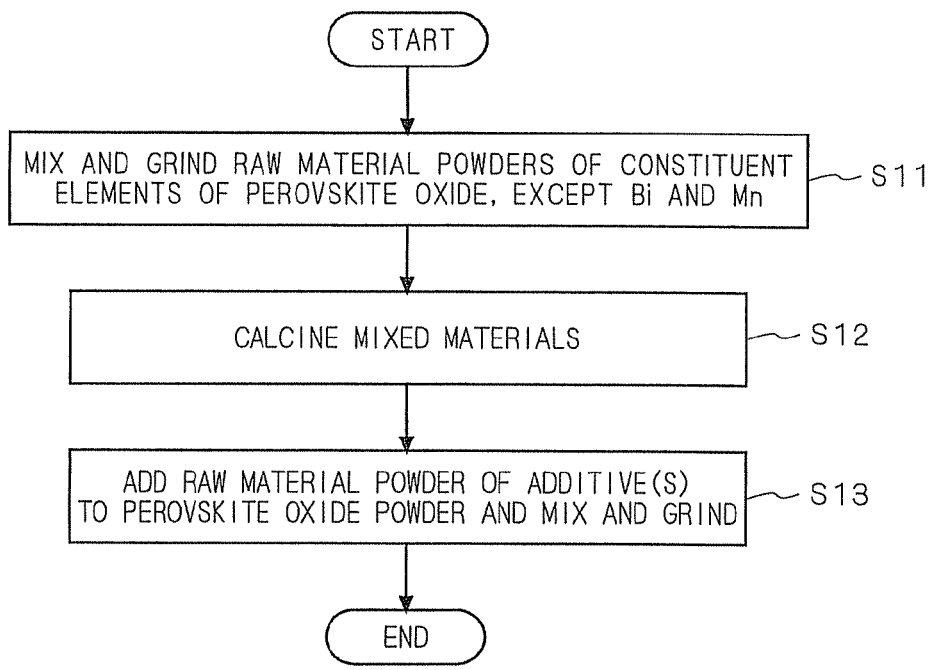
FIG. 1 is a flowchart illustrating the flow of manufacturing ceramic powder of a piezoelectric/electrostrictive ceramic composition.

A piezoelectric/electrostrictive ceramic composition according to a preferred embodiment of the present invention will now be described, and actuators using the piezoelectric/electrostrictive ceramic composition will then be described. It is to be noted, however, that the following description is not intended to limit the applications of the piezoelectric/electrostrictive ceramic composition to actuators. For example, the piezoelectric/electrostrictive ceramic composition may be used in piezoelectric/electrostrictive elements such as sensors.

<1 Piezoelectric/Electrostrictive Ceramic Composition>
{Composition}

A piezoelectric/electrostrictive ceramic composition according to a preferred embodiment of the present invention is a (Li, Na, K)(Nb, Ta)$O_3$-based piezoelectric/electrostrictive ceramic composition that is obtained by adding a Bi (bismuth) compound to a perovskite oxide that contains Li (lithium), Na (sodium) and K (potassium) as A-site elements, and at least Nb (niobium) and Sb (antimony) as B-site elements, out of Nb, Ta (tantalum) and Sb, wherein the A-site elements surpass the B-site elements.

The composition of the perovskite oxide as the main component is preferably an alkali niobate represented by the general formula of $\{Li_y(Na_{1-x}K_x)_{1-y}\}_a(Nb_{1-z-w}Ta_zSb_w)O_3$. It is also preferred that a, x, y, z and w satisfy the relations:

$1<a\leq1.1$, $0.30\leq x\leq0.70$, $0.02\leq y\leq0.10$, $0.0\leq z\leq0.5$, and $0.01\leq w\leq0.1$, respectively. When the composition of the perovskite oxide is within this range, the electric field-induced distortion at the time of application of a high electric field can be improved.

It is preferable to use an oxide such as $Bi_2O_3$ (bismuth oxide) as the Bi compound. Also, as the Bi compound, a carbonate such as $Bi_2(CO_3)_3$ (bismuth carbonate), a hydroxide such as $Bi(OH)_3$ (bismuth hydroxide), an organic acid salt such as $Bi_2(C_4H_4O_6)_3$ (bismuth tartrate), or an alkoxide such as $Bi(OC_2H_5)_3$ (triethoxybismuth) that turn oxide when reacted with the perovskite oxide, can be used, for example.

The amount of addition of the Bi compound relative to 100 molar parts of the perovskite oxide is preferably equal to or greater than 0.02 molar part and equal to or smaller than 0.1 molar part in terms of Bi atoms. When the amount of addition of the Bi compound is within this range, the electric field-induced distortion at the time of application of a high electric field can be improved. It is not clear how the addition of Bi compound improves the electric field-induced distortion at the time of application of a high electric field, but it is thought that the addition of Bi compound increases oxygen defects and the defects contribute to distortion properties.

It is also preferable to add a Mn (manganese) compound to the perovskite oxide. The addition of a Mn compound improves the electric field-induced distortion at the time of application of a high electric field. When a Mn compound is added to the perovskite oxide in which the A-site elements surpass the B-site elements as described above, the hardening caused by the introduction of Mn can be prevented. Oxides such as $MnO$, $MnO_2$ or $Mn_3O_4$ (manganese oxides) can be used as the Mn compound. Also, as the Mn compound, a carbonate such as $MnCO_3$ (manganese carbonate), a hydroxide such as $Mn(OH)_2$ (manganese hydroxide) or an organic acid salt such as $Mn_2(C_4H_4O_6)_3$ (manganese tartrate) that turn oxide when reacted with the perovskite oxide, can be used, for example.

The amount of addition of the Mn compound relative to 100 molar parts of the perovskite oxide is preferably equal to or greater than 0.01 molar part and equal to or smaller than 3 molar parts in terms of Mn atoms. When the amount of addition of the Mn compound is within this range, the electric field-induced distortion at the time of application of a high electric field can be improved.

{Manufacturing of Ceramic Powder}

FIG. 1 is a flowchart illustrating the manufacture flow of the ceramic powder of the piezoelectric/electrostrictive ceramic composition according to the preferred embodiment of the present invention.

In the manufacture of the ceramic powder, first, powders of raw materials of constituent elements of the perovskite oxide (e.g. Li, Na, K, Nb, Ta, Sb), except Bi and Mn, are mixed and ground (step S11). As the raw materials, oxides, carbonates, organic acid salts, or alkoxides of the respective constituent elements are used, for example. The mixing and grinding can be performed with, e.g. a ball mill. When the mixing and grinding is performed by wet process, an organic solvent such as ethanol, toluene or acetone can be used as a dispersing medium, and the dispersing medium can be removed by, e.g. evaporation or filtration, after the mixing and grinding.

Next, the mixed material thus obtained is calcined (step S12). Thus, the powders of raw materials of the constituent elements of the perovskite oxide react, and perovskite oxide powder is synthesized. This calcination is preferably carried out using a calcining profile in which the highest temperature is not less than 600° C. and not more than 800° C. and the highest temperature is maintained for not less than 2 hours and not more than 8 hours (typically, for 5 hours) in an atmosphere of air. When the highest temperature of calcination (hereinafter referred to as "calcination temperature") is below this range, the reaction of raw material powders tends to be insufficient. Also, when the calcination temperature exceeds this range, subsequent grinding tends to be difficult. The calcination can be carried out in an oxygen atmosphere.

It is not essential to synthesize the perovskite oxide powder by solid phase synthesis, but it may be synthesized by liquid phase synthesis such as sol-gel process or hydrothermal synthesis. Alternatively, the perovskite oxide may be synthesized via intermediates including a plurality of A-site constituent elements and/or B-site constituent elements.

After synthesizing the powder of perovskite oxide, powder of a raw material of a Bi compound as an additive is added to the perovskite oxide powder thus obtained, and the materials are mixed and ground (step S13). At this time, a Mn compound may be added as well as the Bi compound. The mixing and grinding can be carried out with a ball mill, attritor, sand mill, beads mill, etc. When the grinding is performed by wet process, an organic solvent such as ethanol, toluene or acetone can be used as a dispersing medium, and the dispersing medium can be removed by, e.g. evaporation or filtration, after the mixing and grinding.

The calcining process may be carried out twice or more. In this case, the obtained calcined powder alone, without the addition of Bi compound and Mn compound, is ground by a step similar to step S13, and then the second and following calcining process(es) are carried out. It is preferred that the second calcination temperature be set equal to, or higher than, the first calcination temperature. When the second calcination temperature is lower than the first calcination temperature, the synthesis of perovskite oxide may possibly be insufficient.

{Manufacturing of Ceramic Sintered Body}

Figure 2:
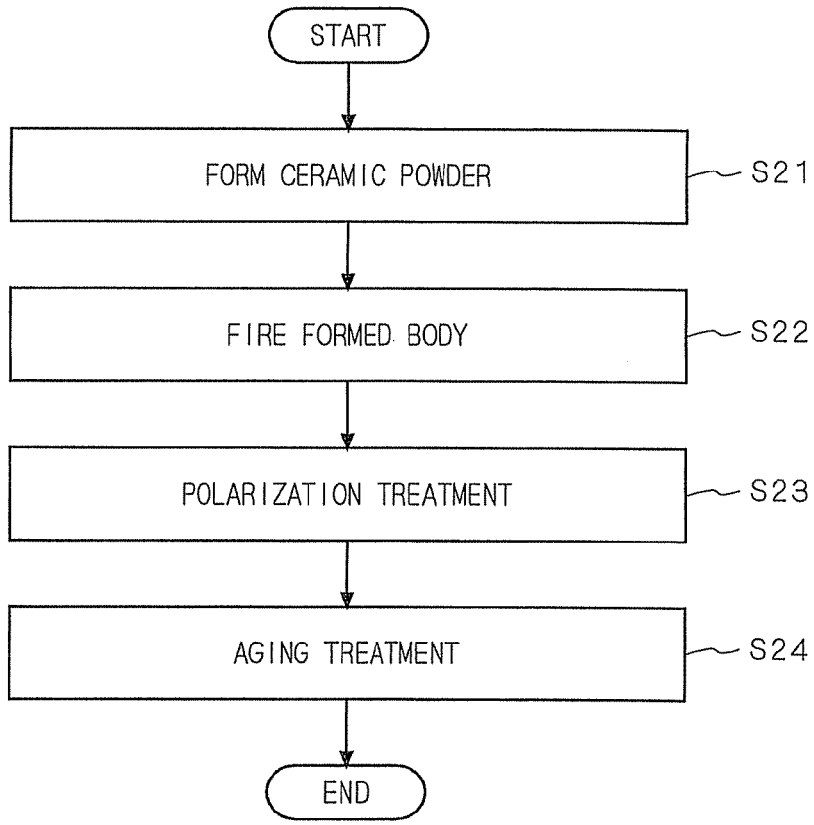
FIG. 2 is a flowchart illustrating the flow of manufacturing a ceramic sintered body.

FIG. 2 is a flowchart illustrating the flow of manufacturing a ceramic sintered body of the piezoelectric/electrostrictive ceramic composition according to the preferred embodiment of the present invention.

The sintered body is produced by forming the ceramic powder produced through steps S11 to S13 (step S21) and firing the formed body (step S22). This firing causes the perovskite oxide and the additive(s) to react with each other.

The forming process can be carried out by extrusion, injection molding, pressure forming, casting, tape forming, cold isostatic pressing (CIP) forming, etc. The firing process can be carried out by ordinary atmospheric firing, or pressure firing such as hot pressing or hot isostatic pressing (HIP). Particularly, a sintered body having large electric field-induced distortion at the time of application of a high electric field can be easily obtained by uniaxially forming by pressure forming, performing cold isostatic pressing forming, and firing by hot pressing. Preferably, the firing is carried out using a firing profile in which the highest temperature is not less than 900° C. nor more than 1200° C.

After the firing, the sintered body is subjected to a polarization treatment (Step S23) and an aging treatment (Step S24).

In the polarization treatment, the sintered body, on which electrodes for polarization are formed, is dipped in insulating oil, such as silicone oil, and heated from 20 to 150° C., with the application of an electric field of 2 to 10 kV/mm. In the aging treatment, the sintered body with the polarization electrodes opened is heated from 0 to 300° C. in the atmosphere and held for 0.5 hour or more. Particularly, the electric field-induced distortion at the time of application of a high electric field can be made larger by performing high-temperature aging treatment in which the sintered body is heated from 100 to 300° C. and held for 0.5 hour or more.

<2 Piezoelectric/Electrostrictive Actuators>

{Overall Structure}

Figure 3:
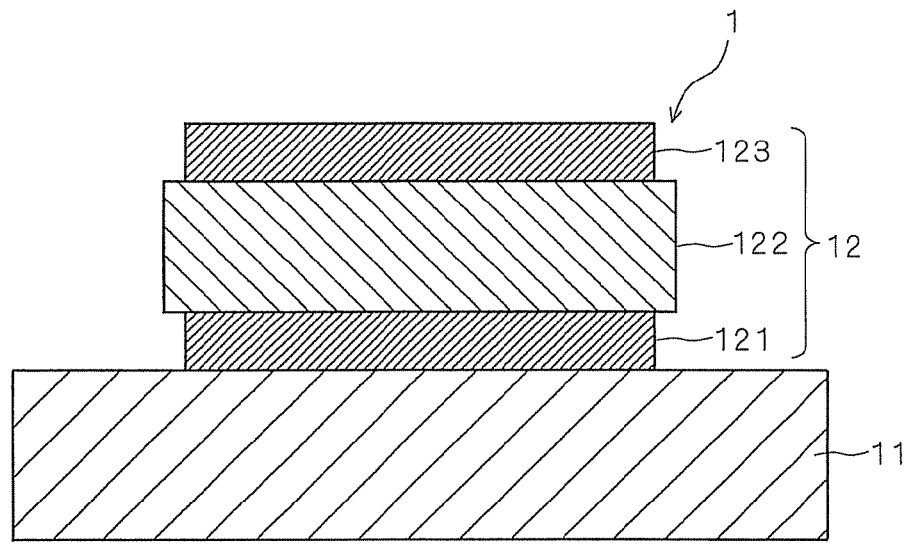
FIG. 3 is a cross-sectional view of a single-layer piezoelectric/electrostrictive actuator.
Figure 4:
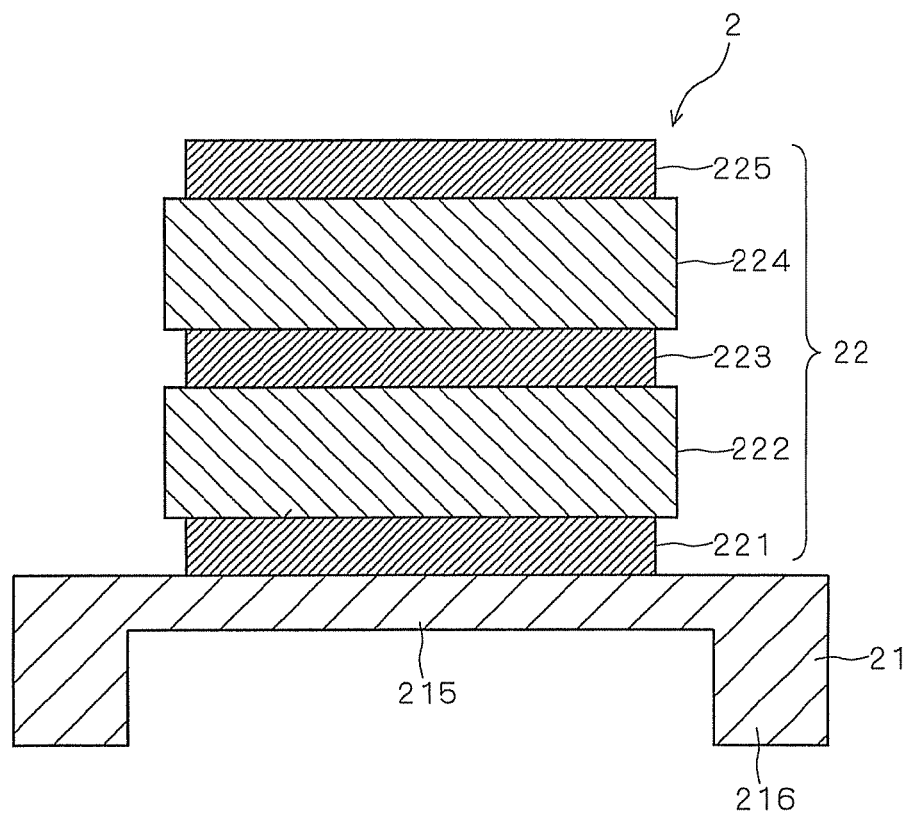
FIG. 4 is a cross-sectional view of a multilayer piezoelectric/electrostrictive actuator.

FIGS. 3 and 4 are schematic diagrams exemplarily showing the structures of piezoelectric/electrostrictive actuators 1 and 2 using the piezoelectric/electrostrictive ceramic composition described above, where FIG. 3 is a cross-sectional view of a single-layer piezoelectric/electrostrictive actuator 1, and FIG. 4 is a cross-sectional view of a multilayer piezoelectric/electrostrictive actuator 2.

As shown in FIG. 3, the piezoelectric/electrostrictive actuator 1 has a structure in which an electrode film 121, a piezoelectric/electrostrictive body film 122, and an electrode film 123 are stacked in this order over the upper surface of a substrate 11. The electrode films 121 and 123 on both main surfaces of the piezoelectric/electrostrictive body film 122 oppose each other across the piezoelectric/electrostrictive body film 122. The multilayer body 12 formed of the lamination of the electrode film 121, piezoelectric/electrostrictive body film 122, and electrode film 123 is stuck to the substrate 11.

As shown in FIG. 4, the piezoelectric/electrostrictive actuator 2 has a structure in which an electrode film 221, a piezoelectric/electrostrictive body film 222, an electrode film 223, a piezoelectric/electrostrictive body film 224, and an electrode film 225 are stacked in this order over the upper surface of a substrate 21. The electrode films 221 and 223 on both main surfaces of the piezoelectric/electrostrictive body film 222 oppose each other across the piezoelectric/electrostrictive body film 222, and the electrode films 223 and 225 on both main surfaces of the piezoelectric/electrostrictive body film 224 oppose each other across the piezoelectric/electrostrictive body film 224. The multilayer body 22 formed of the lamination of the electrode film 221, piezoelectric/electrostrictive body film 222, electrode film 223, piezoelectric/electrostrictive body film 224, and electrode film 225 is stuck to the substrate 21. FIG. 4 illustrates piezoelectric/electrostrictive body films in two layers, but piezoelectric/electrostrictive body films may be formed in three or more layers.

"Stick" herein means bonding the multilayer body 12, 22 to the substrate 11, 21 by a solid phase reaction at the interface between the substrate 11, 21 and the multilayer body 12, 22 without using organic or inorganic adhesive agent. Also, the multilayer body may be bonded to the substrate by a solid phase reaction at the interface between the substrate and the lowermost piezoelectric/electrostrictive body film of the multilayer body.

When voltage is applied to the piezoelectric/electrostrictive actuator 1 or 2, the piezoelectric/electrostrictive body 122, or bodies 222 and 224, stretch/shrink in a direction perpendicular to the electric field according to the applied voltage, and bending displacement is caused as a result.

{Piezoelectric/Electrostrictive Body Films}

The piezoelectric/electrostrictive body films 122, 222 and 224 are sintered bodies of the piezoelectric/electrostrictive ceramic composition described above.

The film thicknesses of the piezoelectric/electrostrictive films 122, 222 and 224 are preferably 0.5 to 50 µm, more preferably 0.8 to 40 µm, and most preferably 1 to 30 µm. When the thicknesses are below this range, the densification tends to be insufficient. When the thicknesses exceed this range, the shrinkage stress during sintering is higher, which requires forming the substrates 11 and 21 thicker, making it difficult to downsize the piezoelectric/electrostrictive actuators 1 and 2.

{Electrode Films}

The material of the electrode films 121, 123, 221, 223 and 225 is metal such as platinum, palladium, rhodium, gold or silver, or an alloy of such metals. Particularly, platinum or alloys mainly containing platinum are preferred because such materials offer high heat resistance during firing. Depending on the firing temperature, alloys of silver-palladium, for example, can be suitably used.

The thicknesses of the electrode films 121, 123, 221, 223 and 225 are preferably equal to or smaller than 15 µm, and more preferably equal to or smaller than 5 µm. When the thicknesses exceed this range, the electrode films 121, 123, 221, 223 and 225 function as buffer layers and the bending displacement tends to be small. The thicknesses are preferably set equal to or larger than 0.05 µm so that the electrode films 121, 123, 221, 223 and 225 appropriately fulfill their function.

It is preferable to form the electrode films 121, 123, 221, 223 and 225 to cover the regions of the piezoelectric/electrostrictive body films 122, 222 and 224 that substantially contribute to bending displacement. For example, it is preferable to form them to cover 80% or more of both main surfaces of the piezoelectric/electrostrictive body films 122, 222 and 224 including central portions thereof.

{Substrate}

The material of the substrates 11 and 21 is ceramic, but the ceramic is not specifically limited. From the aspects of heat resistance, chemical stability and insulation properties, preferred materials include ceramics containing at least one kind selected from the group consisting of stabilized zirconium oxide, aluminum oxide, magnesium oxide, mullite, aluminum nitride, silicon nitride and glass. Particularly, from the aspects of mechanical strength and tenacity, stabilized zirconium oxide is more preferred. "Stabilized zirconium oxide" means zirconium oxide in which crystal phase transition is suppressed by the addition of stabilizer, and includes partially stabilized zirconium oxide as well as stabilized zirconium oxide.

Examples of stabilized zirconium oxide include zirconium oxides containing, as stabilizer, 1 to 30 mol % of calcium oxide, magnesium oxide, yttrium oxide, ytterbium oxide, cerium oxide or rare-earth metal oxide. Particularly, zirconium oxide containing yttrium oxide as stabilizer is preferred because of its particularly high mechanical strength. The content of yttrium oxide is preferably 1.5 to 6 mol %, and more preferably 2 to 4 mol %. It is also more preferable to include 0.1 to 5 mol % of aluminum oxide in addition to yttrium oxide. The crystal phases of stabilized zirconium oxide can be a mixture system of cubic system and monoclinic system, a mixture system of tetragonal system and monoclinic system, or a mixture system of cubic system, tetragonal system and monoclinic system, for example, but it is preferred that the main crystal phase be a mixture system of tetragonal system and cubic system, or tetragonal system, from the aspects of mechanical strength, tenacity and durability.

The thicknesses of the substrates 11 and 21 are preferably 1 to 1000 µm, more preferably 1.5 to 500 µm, and most preferably 2 to 200 µm. If the thickness is below this range, the mechanical strength of the piezoelectric/electrostrictive actuators 1 and 2 tends to be reduced. If the thickness exceeds this range, the rigidity of the substrates 11 and 21 is high, which tends to reduce the bending displacement caused by stretching/shrinkage of the piezoelectric/electrostrictive body film 122 or films 222 and 224 with the application of voltage.

The surface shapes of the substrates 11 and 12 (the shape of the surface to which the multilayer body is bonded) are not particularly limited, and they can be triangular, tetragonal (rectangular or square), elliptical or circular, and the corners may be rounded when they are shaped triangular or tetragonal. Alternatively, they can be composite shapes of such basic shapes.

The substrate 11 of the single-layer piezoelectric/electrostrictive actuator 1 has a uniform thickness. On the other hand, the substrate 21 of the multilayer piezoelectric/electrostrictive actuator 2 has a thickness in which a central portion 215 to which the multilayer body 22 is bonded is thinner than peripheral portions 216. This is intended to increase the bending displacement while keeping the mechanical strength of the substrate 21. The substrate 21 may be used in the single-layer piezoelectric/electrostrictive actuator 1.

Figure 5:
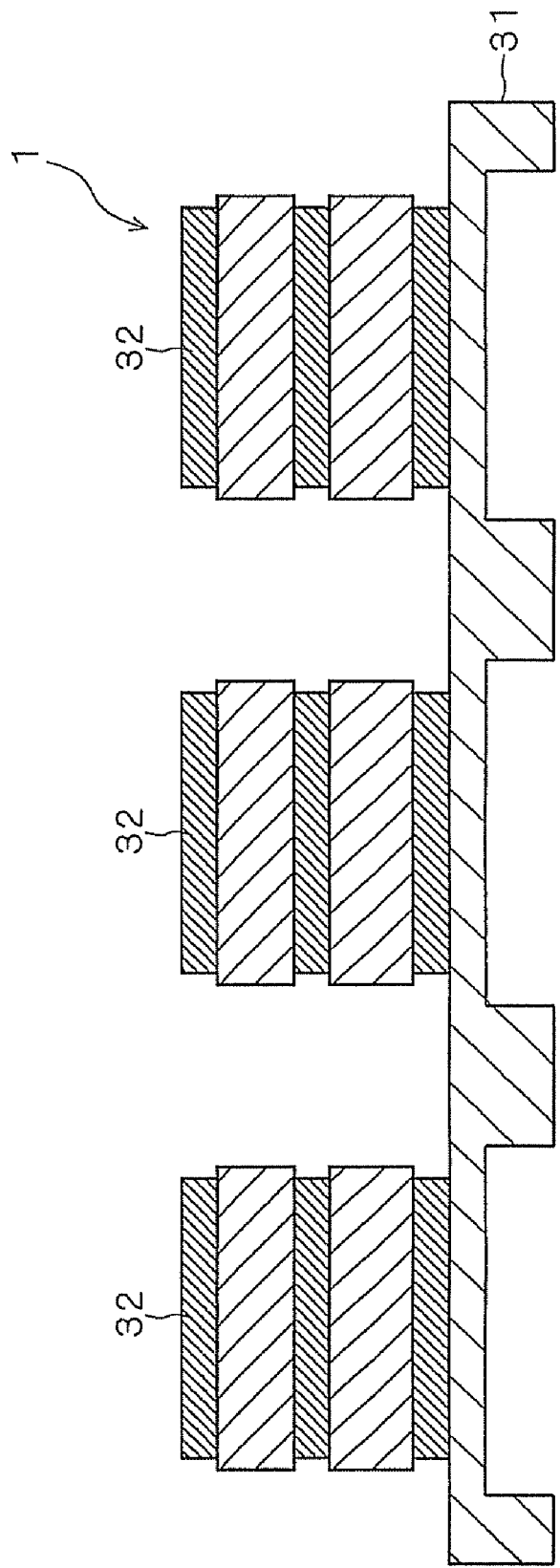
FIG. 5 is a cross-sectional view of a multilayer piezoelectric/electrostrictive actuator.

As shown in the cross-sectional view of FIG. 5, a substrate 31 may be used in which the substrate 21 shown in FIG. 4 as a unit structure is repeatedly provided. In this case, a multilayer body 32 is bonded on each of the unit structures to form a piezoelectric/electrostrictive actuator 3.

{Manufacturing of Piezoelectric/Electrostrictive Actuator}

In the manufacture of the single-layer piezoelectric/electrostrictive actuator 1, first, the electrode film 121 is formed on the substrate 11. The electrode film 121 can be formed by a method such as ion beam, sputtering, vacuum deposition, PVD (Physical Vapor Deposition), ion plating, CVD (Chemical Vapor Deposition), plating, aerosol deposition, screen printing, spraying, dipping, and so on. Particularly, sputtering or screen printing is preferred from the aspect of bondability between the substrate 11 and the piezoelectric/electrostrictive body film 122. The electrode film 121 thus formed can be bonded to the substrate 11 and the piezoelectric/electrostrictive body film 122 by heat treatment. The heat treatment temperature is approximately 500 to 1400° C. though it depends on the material and the method of forming the electrode film 121.

Next, the piezoelectric/electrostrictive body film 122 is formed on the electrode film 121. The piezoelectric/electrostrictive body film 122 can be formed by a method such as ion beam, sputtering, vacuum deposition, PVD (Physical Vapor Deposition), ion plating, CVD (Chemical Vapor Deposition), plating, sol-gel process, aerosol deposition, screen printing, spraying, dipping, and so on. Particularly, screen printing is preferred because it can continuously form the piezoelectric/electrostrictive body film with highly accurate plane shape and film thickness.

The electrode film 123 is then formed on the piezoelectric/electrostrictive body film 122. The electrode film 123 can be formed in a way similar to that for the electrode film 121.

After that, the substrate 11 on which the multilayer body 12 is formed is fired together. This firing promotes the sintering of the piezoelectric/electrostrictive body film 122 and thermally treats the electrode films 121 and 123. The highest temperature of firing of the piezoelectric/electrostrictive body film 122 is preferably 800 to 1250° C., and more preferably 900 to 1200° C. If the temperature is below this range, the densification of the piezoelectric/electrostrictive body film 122 tends to be insufficient, and the bonding between the substrate 11 and the electrode film 121 and the bonding between the electrode films 121 and 123 and the piezoelectric/electrostrictive body film 122 tend to be imperfect. If the temperature exceeds this range, the piezoelectric/electrostrictive properties of the piezoelectric/electrostrictive body film 122 tend to be deteriorated. Also, the time period for which the highest firing temperature is maintained is preferably one minute to ten hours, and more preferably five minutes to four hours. If the time is below this range, the densification of the piezoelectric/electrostrictive body film 122 tends to be insufficient. If the time exceeds this range, the piezoelectric/electrostrictive properties of the piezoelectric/electrostrictive body film 122 tend to be deteriorated.

Performing the heat treatment of the electrode films 121 and 123 at the same time with the firing is preferred from the aspect of productivity, but this does not preclude performing a heat treatment each time the electrode film 121, 123 is formed. However, when the piezoelectric/electrostrictive body film 122 is fired before the heat treatment to the electrode film 123, the electrode film 123 is heat-treated at temperatures lower than the firing temperature of the piezoelectric/electrostrictive body film 122.

After the firing, a polarization treatment is performed under appropriate conditions. The polarization treatment can be performed by a well-known method, and heating to 40 to 200° C. is suitable, though it depends on the Curie temperature of the piezoelectric/electrostrictive body film 122.

The multilayer piezoelectric/electrostrictive actuator 2 can be manufactured similarly to the single-layer piezoelectric/electrostrictive actuator 1 except that the numbers of piezoelectric/electrostrictive films and electrode films to be formed are larger.

Alternatively, the piezoelectric/electrostrictive actuator 1 can be manufactured by a green sheet layering method that is ordinarily used to manufacture multilayer ceramic electronic components. In the green sheet layering method, first, a binder, plasticizer, dispersing agent and dispersing medium are added to the material powder, and the materials are mixed by using a ball mill, for example. Then, the slurry thus obtained is formed into a sheet shape by, e.g. doctor blade, to obtain a formed body.

Subsequently, films of an electrode paste are printed on both main surfaces of the formed body by screen printing, for example. The electrode paste used in this process is obtained by adding a solvent, vehicle, glass frit, etc. to powder of metal or alloy mentioned above.

Next, the formed body having the electrode paste films printed on both main surfaces is pressure-bonded to the substrate.

After that, the substrate on which the multilayer body is formed is fired together, and, after the firing, subjected to a polarization treatment under appropriate conditions.

<3 Another Example of Piezoelectric/Electrostrictive Actuator>

Figure 6:
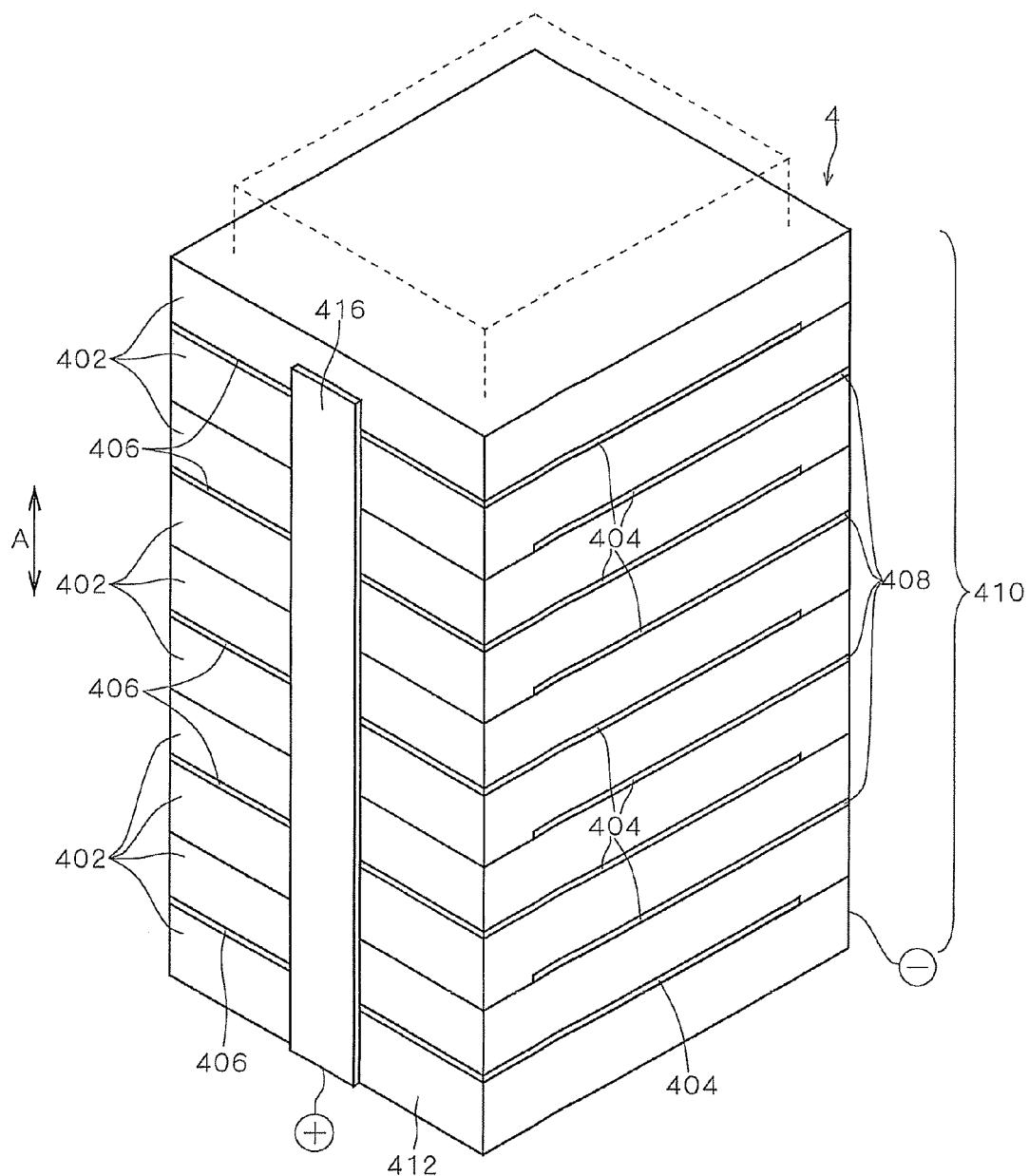
FIG. 6 is a perspective view of a piezoelectric/electrostrictive actuator.
Figure 7:
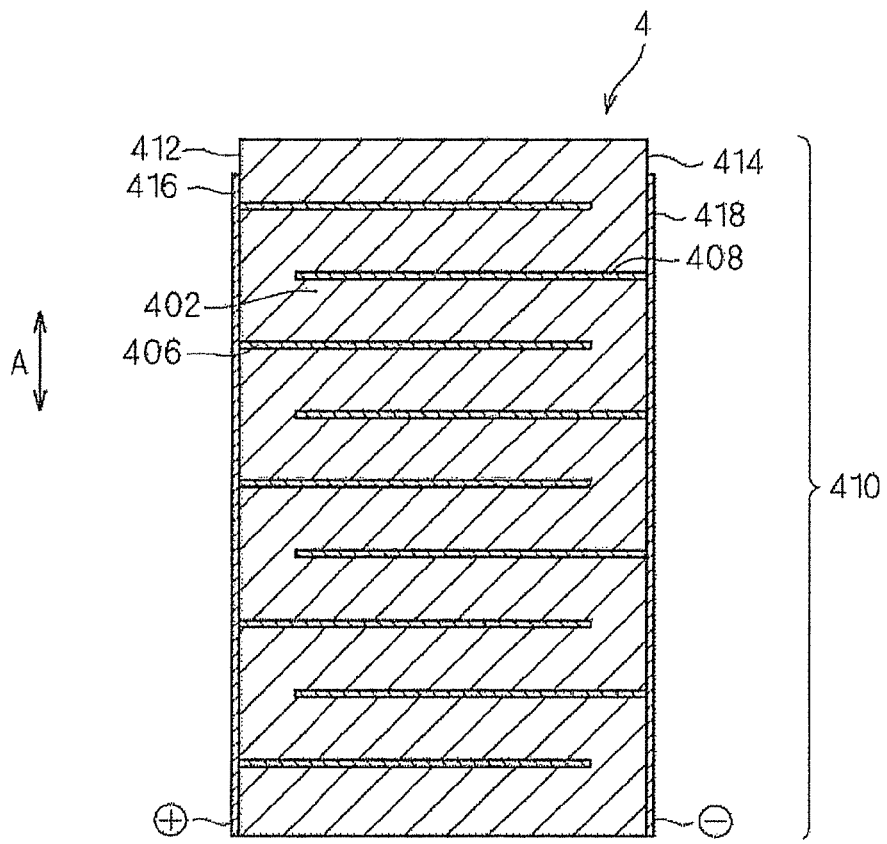
FIG. 7 is a vertical cross-sectional view of the piezoelectric/electrostrictive actuator.
Figure 8:
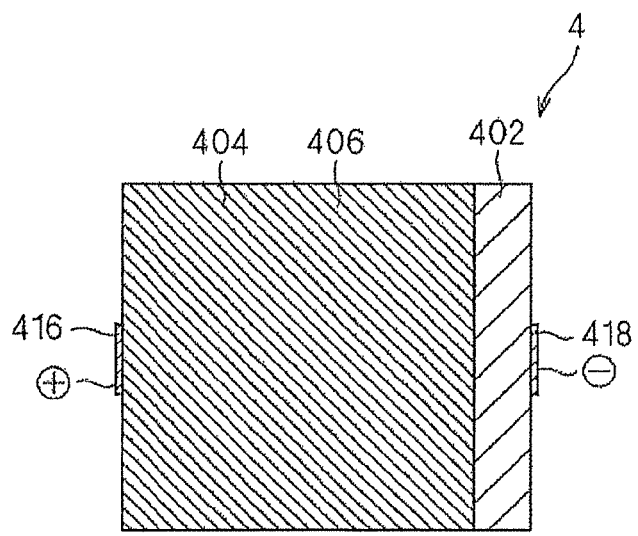
FIG. 8 is a transverse cross-sectional view of the piezoelectric/electrostrictive actuator.

FIGS. 6 to 8 are schematic diagrams exemplarily showing the structure of a piezoelectric/electrostrictive actuator 4 using the above-described piezoelectric/electrostrictive ceramic composition, where FIG. 6 is a perspective view of the piezoelectric/electrostrictive actuator 4, FIG. 7 is a longitudinal cross-sectional view of the piezoelectric/electrostrictive actuator 4, and FIG. 8 is a transverse cross-sectional view of the piezoelectric/electrostrictive actuator 4.

Figure 9:
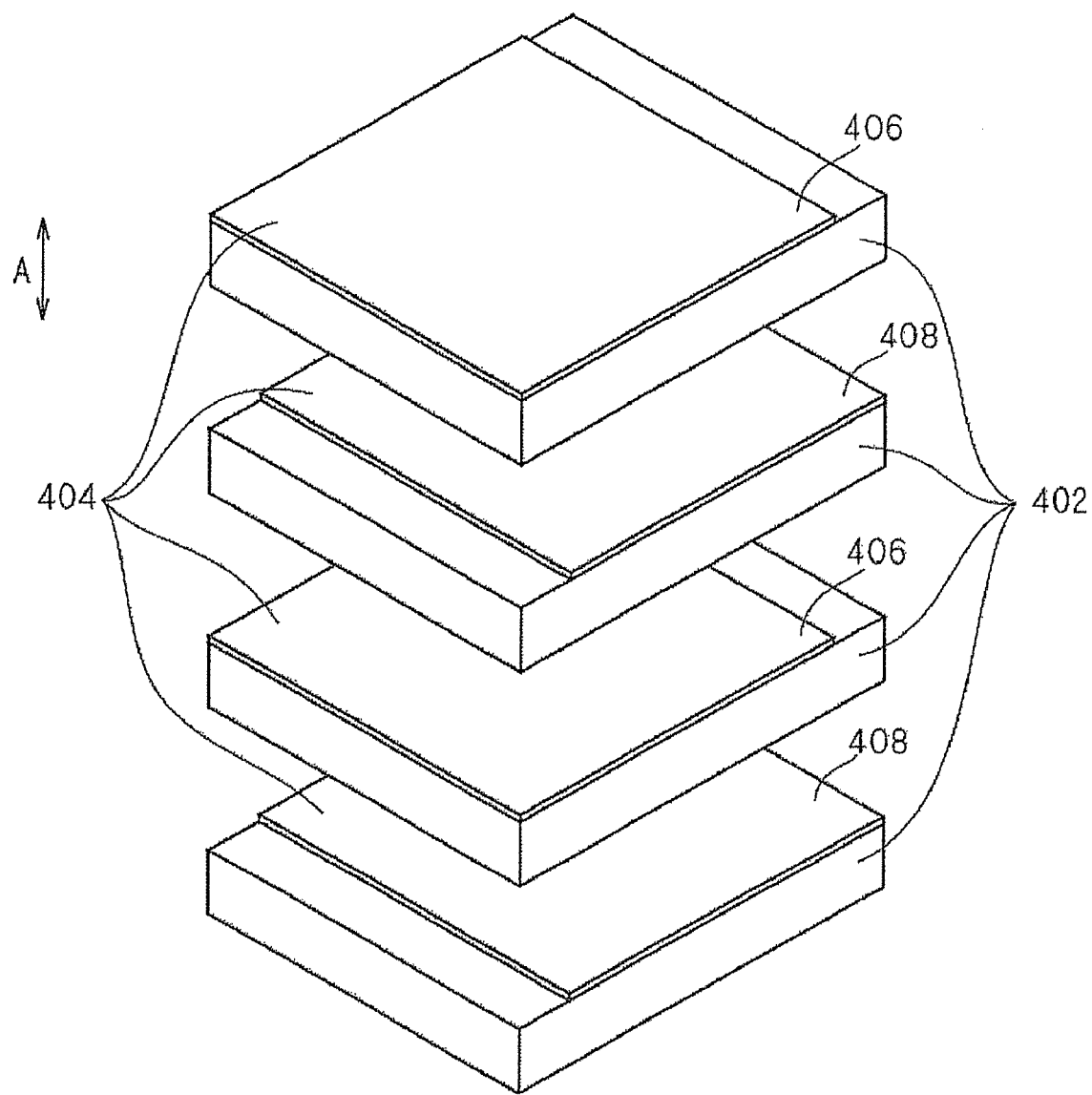
FIG. 9 is an exploded perspective view of a part of the piezoelectric/electrostrictive actuator.

As shown in FIGS. 6 to 8, in the piezoelectric/electrostrictive actuator 4, piezoelectric/electrostrictive body films 402 and internal electrode films 404 are alternately stacked in the direction of axis A, and external electrode films 416 and 418 are formed on the end surfaces 412 and 414 of the multilayer body 410 of the piezoelectric/electrostrictive body films 402 and the internal electrode films 404. As shown in the exploded perspective view of FIG. 9 in which part of the piezoelectric/electrostrictive actuator 4 is exploded in the direction of axis A, the internal electrode films 404 include first internal electrode films 406 that reach the end surface 412 but do not reach the end surface 414, and second internal electrode films 408 that reach the end surface 414 but do not reach the end surface 412. The first internal electrode films 406 and the second internal electrode films 408 are alternately provided. The first internal electrode films 406 are in contact with the external electrode film 416 on the end surface 412 and electrically connected to the external electrode film 416. The second internal electrode films 408 are in contact with the external electrode film 418 on the end surface 414 and electrically connected to the external electrode film 418. Therefore, when the external electrode film 416 is connected to the positive side of a driving signal source and the external electrode film 418 is connected to the negative side thereof, a driving signal is applied to the first internal electrode films 406 and the second internal electrode films 408 opposing across the piezoelectric/electrostrictive body films 402, and an electric field is applied in the thickness direction of the piezoelectric/electrostrictive body films 402. As a result, the piezoelectric/electrostrictive body films 402 stretch/shrink in the thickness direction, and the multilayer body 410 as a whole deforms into the shape indicated by broken line in FIG. 6.

Unlike the piezoelectric/electrostrictive actuators 1 to 3 described earlier, the piezoelectric/electrostrictive actuator 4 does not include a substrate to which the multilayer body 410 is bonded. The piezoelectric/electrostrictive actuator 4 is also called "an offset-type piezoelectric/electrostrictive actuator" since the first internal electrode films 406 and the second internal electrode films 408 having different patterns are alternately provided.

The piezoelectric/electrostrictive body films 402 are formed of the sintered body of the piezoelectric/electrostrictive ceramic composition described above. The thicknesses of the piezoelectric/electrostrictive body films 402 are preferably 5 to 500 μm. If the thickness is below this range, it is difficult to produce green sheets described below. If the thickness exceeds this range, it is difficult to apply a sufficient electric field to the piezoelectric/electrostrictive body films 402.

The materials of the internal electrode films 404 and the external electrode films 416 and 418 are metal such as platinum, palladium, rhodium, gold or silver, or an alloy thereof. Particularly, the material of the internal electrode films 404 is preferably platinum or an alloy mainly containing platinum, since such materials offer high heat resistance in firing and are easy to co-sinter with the piezoelectric/electrostrictive body films 402. However, depending on the firing temperature, alloys of silver-palladium, for example, can also be suitably used.

The film thickness of the internal electrode films 404 is preferably equal to or smaller than 10 μm. If the thickness exceeds this range, the internal electrode films 404 function as buffer layers and the displacement tends to be small. Also, the film thickness is preferably set equal to or larger than 0.1 μm so that the internal electrode films 404 appropriately fulfill their function.

FIGS. 6 to 8 show piezoelectric/electrostrictive body films 402 in ten layers, but the piezoelectric/electrostrictive body films 402 may be provided in nine or fewer layers or in eleven or more layers.

In the manufacture of the piezoelectric/electrostrictive actuator 4, first, a binder, plasticizer, dispersing agent and dispersing medium are added to the material powder of the above-described piezoelectric/electrostrictive ceramic composition, and the materials are mixed by using a ball mill, for example. The resultant slurry is formed into a sheet shape by, e.g. doctor blade, to obtain green sheets.

Next, the green sheets are punched with a punch or die, to form positioning holes etc. in the green sheets.

Next, an electrode paste is applied to the surfaces of the green sheets by, e.g. screen printing, to obtain green sheets having electrode paste patterns formed thereon. The electrode paste patterns include two types of patterns: first electrode paste patterns forming the first internal electrode films 406 after firing, and second electrode paste patterns forming the second internal electrode films 408 after firing. Needless to say, the electrode paste patterns may be just one type, in which case alternate green sheets are turned by 180° so as to obtain the internal electrode films 406 and 408 after firing.

Next, the green sheets having first electrode paste patterns and the green sheets having second electrode paste patterns are alternately stacked, a green sheet having no electrode paste is placed on the top, and the stacked green sheets are pressurized and bonded in the thickness direction. In this process, the positioning holes formed in the green sheets are aligned. In pressure-bonding the stacked green sheets, it is also desirable to previously heat the die used for pressure-bonding so that the green sheets are pressure-bonded while being heated.

The pressure-bonded body of green sheets thus obtained is fired, and then the obtained sintered body is processed with, e.g. a dicing saw, to obtain the multilayer body 410. Then, the external electrode films 416 and 418 are formed on the end surfaces 412 and 414 of the multilayer body 410, e.g. by baking, vapor deposition, or sputtering, which is followed by a polarization treatment, whereby the piezoelectric/electrostrictive actuator 4 is obtained.

<4 Experiment 1>

In experiment 1, first, powders of $Li_2CO_3$ (lithium carbonate), $C_4H_5O_6Na \cdot H_2O$ (sodium hydrogen tartrate monohydrate), $C_4H_5O_6K$ (potassium hydrogen tartrate), $Nb_2O_5$ (niobium oxide), $Ta_2O_5$ (tantalum oxide), and $Sb_2O_5$ (antimony oxide) were weighed to obtain the compositions shown in FIGS. 10 to 14, alcohol was added as a dispersing medium to the weighted raw material powders, and the materials were mixed and ground with a ball mill.

Next, after removing the dispersing medium from the obtained slurry, a first calcination process was performed using a calcining profile in which 800° C. was kept for five hours, to synthesize powder of a perovskite oxide.

Next, alcohol was added as a dispersing medium to the obtained perovskite oxide, and the material was ground with a ball mill.

Next, after removing the dispersing medium from the obtained slurry, a second calcination process was performed using a calcining profile in which 800° C. was kept for five hours.

Next, the powder of the perovskite oxide calcined twice and powders of $Bi_2O_3$ and $MnO_2$ as additives were weighed to obtain the amounts of addition shown in FIGS. 10 to 13, alcohol was added as a dispersing medium to the weighed perovskite oxide powder and $Bi_2O_3$ and $MnO_2$ powders, the materials were mixed and ground with a ball mill, and the dispersing medium was removed from the obtained slurry.

After producing ceramic powder in this way, the ceramic powder with a binder mixed therein was uniaxially pressed into a disc shape having a diameter of 20 mm and a thickness of 6 mm at a pressure of $2.0 \times 10^8$ Pa, and further subjected to cold isostatic pressing forming. The formed body was then fired using a firing profile in which 1000° C. was kept for three hours in an air atmosphere at atmospheric pressure, to obtain a sintered body (piezoelectric/electrostrictive body).

Next, the obtained sintered body was processed into a rectangular shape having a longer side of 12 mm, a shorter side of 3 mm and a thickness of 1 mm, and gold electrodes were formed on both main surfaces thereof by sputtering. The body was dipped in silicone oil at room temperature and a voltage of 5 kV/mm was applied to the gold electrodes on both main surfaces, to apply polarization in the thickness direction.

The distortion ratios $S_{4000}$ (ppm) of the piezoelectric/electrostrictive elements thus produced were measured as an index of the magnitude of electric field-induced distortion at the time of application of a high electric field. Also, the piezoelectric/electrostrictive elements were subjected to a high-temperature aging treatment in which the elements were aged at 250° C. for 12 hours, and the distortion ratios $S_{4000}$ (ppm) were measured again. The measurements are shown in FIGS. 10 to 14.

The distortion ratios $S_{4000}$ were obtained by measuring the electric field-induced distortion in the longer-side direction with the application of a voltage of 4 kV/mm to the gold electrodes on both main surfaces, with a distortion gauge bonded to the electrodes.

As shown in FIG. 10, with experimental samples A1 to A6, the composition of the perovskite oxide was fixed (x=0.45, y=0.06, a=1.01, z=0.082, w=0.04), the amount of addition of $MnO_2$ was fixed (0.02 molar part with respect to the main component of 100 molar parts), and the amount of addition of $Bi_2O_3$ was varied, where the distortion ratios $S_{4000}$ of the experimental samples A2 to A5 to which $Bi_2O_3$ was added were superior to that of the experimental sample A1 to which $Bi_2O_3$ was not added; however, cracks formed in the sintered body and the distortion factor $S_{4000}$ could not be measured with the experimental sample A6 in which the amount of addition of $Bi_2O_3$ was increased to 0.2 molar part with respect to the main component of 100 molar parts.

Also, as shown in FIG. 11 where "a" indicates the ratio of the total number of atoms of A-site elements to the total number of atoms of B-site elements (hereinafter referred to as "A/B ratio"), with the experimental samples B1 to B4, while the compositional modifications of increasing "a" to 1.1 and so on was executed, the composition of the perovskite oxide was fixed (x=0.6, y=0.07, a=1.1, z=0.3, w=0.06), the amount of addition of $MnO_2$ was fixed (1 molar part with respect to the main component of 100 molar parts), and the amount of addition of $Bi_2O_3$ was varied, where the distortion ratios $S_{4000}$ of the experimental samples B2 and B3 to which $Bi_2O_3$ was added were superior, again, to that of the experimental sample B1 to which $Bi_2O_3$ was not added; however, cracks formed in the sintered body and the distortion ratio $S_{4000}$ could not be measured with the experimental sample B4 in which the amount of addition of $Bi_2O_3$ was increased to 0.2 molar part with respect to the main component of 100 molar parts.

Also as shown in FIG. 11, with the experimental samples C1 to C4, while the compositional modification of reducing "a" as A/B ratio to 1.005 and so on was executed, the composition of the perovskite oxide was fixed (x=0.3, y=0.03, a=1.005, z=0.03, w=0.01), the amount of addition of $MnO_2$ was fixed (0.02 molar part with respect to the main component of 100 molar parts), and the amount of addition of $Bi_2O_3$ was varied, where the distortion ratios $S_{4000}$ of the experimental samples C2 and C3 to which $Bi_2O_3$ was added were superior, again, to that of the experimental sample C1 to which $Bi_2O_3$ was not added; however, cracks formed in the sintered body and the distortion ratio $S_{4000}$ could not be measured with the experimental sample C4 in which the amount of addition of $Bi_2O_3$ was increased to 0.2 molar part with respect to the main component of 100 molar parts.

As shown in FIG. 12, with the experimental samples D1 to D4 in which "a" as A/B ratio was increased/decreased from that of the experimental sample A2, the distortion ratio $S_{4000}$ could not be measured with the experimental sample D1 in which "a" as A/B ratio was 1, but the experimental samples D2 to D3 in which "a" as A/B ratio was larger than 1 exhibited good distortion ratios $S_{4000}$.

Also, as shown in FIG. 13, experimental samples E1 to E2, F1 to F2, G1 to G3, H1 to H2 and I1 to I3, where y, x, z, w and m were increased/decreased from those of the experimental sample A2, also exhibited good distortion ratios $S_{4000}$.

Also as shown in FIG. 13, the experimental sample I4 to which $Bi_2O_3$ was added but $MnO_2$ was not added exhibited a lower distortion ratio $S_{4000}$ than samples to which $Bi_2O_3$ and $MnO_2$ were both added, e.g. the experimental sample I2, but the distortion ratio $S_{4000}$ of the experimental sample I4 was higher than those of samples to which neither of $Bi_2O_3$ and $MnO_2$ was added, e.g. the experimental sample I5.

With experimental samples whose distortion ratios $S_{4000}$ could be measured, the distortion ratios $S_{4000}$ of them all could be further improved by the high-temperature aging treatment.

<5 Experiment 2>

In experiment 2, an experimental sample J1 having the same composition as the experimental sample A2, and an experimental sample J2 having the same composition as the experimental sample A5, were produced and evaluated, where the conditions were the same as those of experiment 1 except that all raw material powders including powders of $Bi_2O_3$ and $MnO_2$ were mixed and ground before the first calcination process. FIG. 14 shows the results. The experimental sample J1 just offered a distortion ratio $S_{4000}$ similar to that of the experimental sample A1 to which $Bi_2O_3$ was not added, and with the experimental sample J2, cracks formed in the sintered body and the distortion ratio $S_{4000}$ could not be measured.

With the experimental sample J1 whose distortion ratio $S_{4000}$ could be measured, the distortion ratio $S_{4000}$ could be further improved by the high-temperature aging treatment.

<6 Summary of Experiments>

Experiments 1 and 2 showed that the distortion ratio $S_{4000}$ can be improved by synthesizing an alkali niobate represented by the general formula of $\{Li_y(Na_{1-x}K_x)_{1-y}\}_a(Nb_{1-z-w}Ta_zSb_w)O_3$ and satisfying the relations: $1<a\leq1.1$, $0.30\leq x\leq0.70$, $0.02\leq y\leq0.10$, $0.0\leq z\leq0.5$, and $0.01\leq w\leq0.1$, and then causing $Bi_2O_3$, $MnO_2$ and the perovskite compound to react.

While the invention has been described in detail, the foregoing description is in all aspects illustrative and not restrictive. It is therefore understood that numerous other modifications and variations can be devised without departing from the scope of the invention.

What is claimed is:

1. A method of manufacturing a piezoelectric/electrostrictive ceramic composition, comprising the steps of:
    (a) synthesizing a perovskite oxide containing Li, Na and K as A-site elements and containing at least Nb and Sb, out of Nb, Ta and Sb, as B-site elements, a ratio of the total number of atoms of the A-site elements to the total number of atoms of the B-site elements being larger than 1; and
    (b) reacting the perovskite oxide synthesized in said step (a) with an additive,
    wherein the additive reacted in said step (b) includes a Bi compound.

2. The method of manufacturing a piezoelectric/electrostrictive ceramic composition according to claim 1, wherein the amount of addition of the Bi compound with respect to 100 molar parts of the perovskite oxide is not less than 0.02 molar part nor more than 0.1 molar part in terms of Bi atoms.

3. The method of manufacturing a piezoelectric/electrostrictive ceramic composition according to claim 1, wherein the additive reacted in said step (b) includes a Mn compound.

4. The method of manufacturing a piezoelectric/electrostrictive ceramic composition according to claim 3, wherein the amount of addition of the Mn compound with respect to 100 molar parts of the perovskite oxide is not less than 0.01 molar part nor more than 3 molar parts in terms of Mn atoms.

5. The method of manufacturing a piezoelectric/electrostrictive ceramic composition according to claim 2, wherein the additive reacted in said step (b) includes a Mn compound.

6. The method of manufacturing a piezoelectric/electrostrictive ceramic composition according to claim 5, wherein the amount of addition of the Mn compound with respect to 100 molar parts of the perovskite oxide is not less than 0.01 molar part nor more than 3 molar parts in terms of Mn atoms.

* * * * *